United States Patent
Liu et al.

(10) Patent No.: US 10,283,393 B1
(45) Date of Patent: May 7, 2019

(54) WAFER CARRYING FORK, SEMICONDUCTOR DEVICE MANUFACTURING SYSTEM, AND WAFER TRANSPORTING METHOD

(71) Applicant: Taiwan Semiconductor Manufacturing Co., Ltd., Hsinchu (TW)

(72) Inventors: Yan-Hong Liu, Hsinchu County (TW); Che-Fu Chen, Taipei (TW); Meng-Chu Li, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/869,074

(22) Filed: Jan. 12, 2018

Related U.S. Application Data (60) Provisional application No. 62/583,420, filed on Nov. 8, 2017.

(51) Int. Cl.
  *H01L 21/67* (2006.01)
  *H01L 21/673* (2006.01)
  *H01L 21/687* (2006.01)
  *H01L 21/677* (2006.01)

(52) U.S. Cl.
  CPC .. *H01L 21/67309* (2013.01); *H01L 21/67778* (2013.01); *H01L 21/68707* (2013.01)

(58) Field of Classification Search
  CPC ............................ B25J 11/0095; B25J 15/0616
  USPC .................................................. 294/185, 213
  See application file for complete search history.

(56) References Cited

U.S. PATENT DOCUMENTS

| | | |
|---|---|---|
| 2009/0175705 A1 | 7/2009 | Nakao et al. |
| 2017/0144313 A1 | 5/2017 | Sakai et al. |

FOREIGN PATENT DOCUMENTS

| | | |
|---|---|---|
| TW | 201304039 | 1/2013 |
| TW | 201341291 | 10/2013 |

OTHER PUBLICATIONS

"Office Action of Taiwan Counterpart Application", dated Jun. 19, 2018, p. 1-p. 7.

*Primary Examiner* — Ronald P Jarrett
(74) *Attorney, Agent, or Firm* — JCIPRNET (57) ABSTRACT

A wafer carrying fork includes a fork body, a plurality of wafer suction holes, a plurality of gas purging elements, a plurality of gas purging pipes, a plurality of gas suction elements, and a plurality of gas suction pipes. The fork body has a top surface, a bottom surface opposite to the top surface, and a plurality of lateral surfaces connecting the top surface and the bottom surface. The wafer suction holes are located on the top surface of the fork body. The gas purging elements are located on the lateral surfaces of the fork body. The gas purging pipes are connected to the gas purging elements. The gas suction elements are located on the bottom surface of the fork body. The gas suction pipes are connected to the gas suction elements.

20 Claims, 4 Drawing Sheets

WAFER CARRYING FORK, SEMICONDUCTOR DEVICE MANUFACTURING SYSTEM, AND WAFER TRANSPORTING METHOD

CROSS-REFERENCE TO RELATED APPLICATION

This application claims the priority benefit of U.S. provisional application Ser. No. 62/583,420, filed on Nov. 8, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. As feature size shrinks, the associated circuits become more sensitive to contamination during the manufacturing process. Many of the manufacturing procedures carried out may result in residues that are capable of damaging the electronic components. Systems and methods to reduce residue and residue vapor have the potential to dramatically improve yield and are of significant value.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
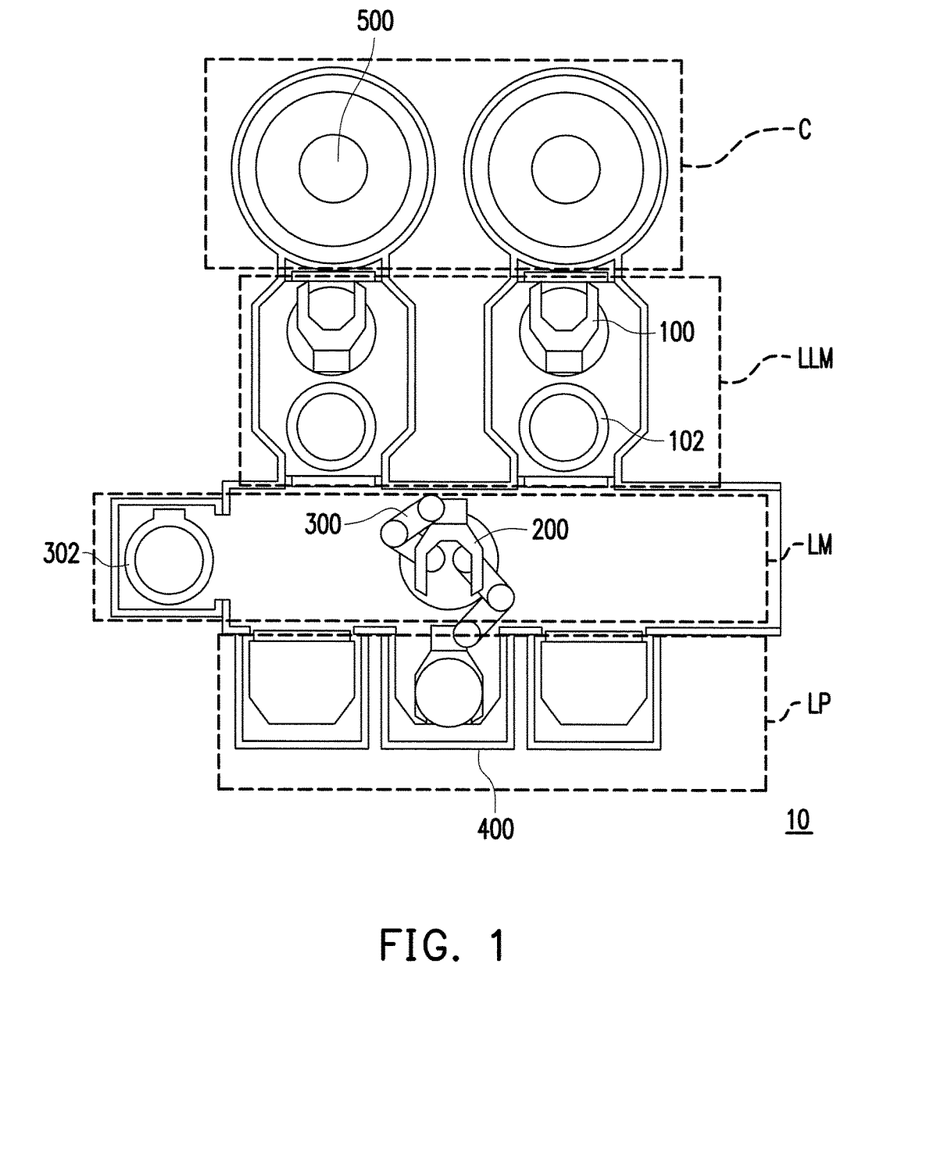
FIG. 1 is a schematic top view of a semiconductor device manufacturing system in accordance with some embodiments of the disclosure.

FIG. 1 is a schematic top view of a semiconductor device manufacturing system 10 in accordance with some embodiments of the disclosure. In some embodiments, the semiconductor device manufacturing system 10 may be configured to process and transport a wafer 500. In some embodiments, the wafer 500 may include one or more semiconductor layer(s), conductor(s), and/or insulator layer(s). The semiconductor layer(s) may include an elementary semiconductor such as silicon or germanium with a crystalline, polycrystalline, amorphous, and/or other suitable structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In some embodiments, combinations of semiconductors may take the form of a mixture or a gradient such as a wafer in which the ratio of Si and Ge vary across locations. In some embodiments, the wafer 500 includes layered semiconductors. For example, the layered semiconductors may be disposed on an insulator to produce a silicon-on-insulator (SOI) wafer, a silicon-on-sapphire wafer, or a silicon-germanium-on-insulator wafer. Alternatively, the layered semiconductors may be disposed on a glass to produce a thin film transistor (TFT). In some embodiments, the wafer 500 may go through many processing steps. For example, the wafer 500 may be subjected to a photolithography process, an etching process, and/or a doping process.

Referring to FIG. 1, the semiconductor device manufacturing system 10 includes a wafer processing chamber C, a load lock module LLM, a load module LM, and a load port LP. In some embodiments, the load lock module LLM is adjacent to the wafer processing chamber C, the load module LM is adjacent to the load lock module LLM, and the load port LP is adjacent to the load module LM. As illustrated in FIG. 1, the wafer processing chamber C, the load lock module LLM, the load module LM, and the load port LP are spatially connected with each other. In other words, the wafer processing chamber C, the chamber of the load lock module LLM, the chamber of load module LM, and the chamber of load port LP are all communicated with each other. In this way, the wafer 500 may be transported freely among the wafer processing chamber C, the load lock module LLM, the load module LM, and the load port LP.

In some embodiments, the wafer processing chamber C may be configured to perform any manufacturing procedure on the wafer 500. In some embodiments, the wafer processing chamber C may be configured to perform deposition processes. Examples of the deposition processes include a physical vapor deposition (PVD) process, a chemical vapor deposition (CVD) process, a plasma-enhanced chemical vapor deposition (PECVD) process, an electrochemical deposition (ECD) process, a molecular beam epitaxy (MBE) process, an atomic layer deposition (ALD) process, and/or other deposition processes. In some embodiments, the wafer processing chamber C may be configured to perform etching processes. Examples of the etching processes include a wet etching process, a dry etching process, and/or an ion beam milling process. In some alternative embodiments, the wafer processing chamber C may be configured to perform a photolithographic exposure process, an ion implantation process, a thermal process (such as an annealing process and/or a thermal oxidation process), a cleaning process (such as a rinsing process and/or a plasma ashing process), a chemical mechanical polishing (CMP) process, a testing process, and/or a combination thereof.

The load lock module LLM is arranged between the wafer processing chamber C and the load module LM. The load lock module LLM may be configured to preserve the atmosphere within the wafer processing chamber C by separating the wafer processing chamber C from the load module LM. In some embodiments, the load lock module LLM includes a plurality of transportation forks 100 and a plurality of stages 102. Each of the transportation forks 100 may be connected to a transportation robot arm (not shown) such that the transportation forks is able to rotate freely. In some embodiments, the transportation fork 100 may be inserted into the wafer processing chamber C to acquire a processed wafer (i.e. the wafer 500). Thereafter, the transportation fork 100 may transport the wafer onto the stage 102 in the load lock module LLM. When the wafer 500 is transported from the wafer processing chamber C or the load module LM into the load lock module LLM, the load lock module LLM is sealed. The load lock module LLM is capable of creating an atmosphere compatible with the wafer processing chamber C or the load module LM depending on where the loaded wafer 500 is scheduled to be next. For example, the gas content within the load lock module LLM may be altered to adjust the atmosphere within the load lock module LLM. The gas content may be adjusted by mechanisms such as addition of gas, creation of vacuum, and/or other suitable methods. When the atmosphere matching the wafer processing chamber C or the load module LM has been reached, the load lock module LLM may be opened, and the wafer 500 located inside of the load lock module LLM may be accessed.

The load module LM is located between the load lock module LLM and the load port LP. In some embodiments, the load module LM is a facility interface. For example, the load module LM may include an equipment front end module (EFEM). In some embodiments, the load module LM includes an automated robot arm 300, a wafer carrying fork 200, and a stage 302. The automated robot arm 300 may be stationed on a rail (not shown) such that the automated robot arm 300 is able to slide along the rail, thereby moving in a horizontal direction. The automated robot arm 300 is able to rotate freely as well. The wafer carrying fork 200 is connected to the automated robot arm 300. For example, the wafer carrying fork 200 is connected to the automated robot arm 300 such that the wafer carrying fork 200 may be rotated freely. In some embodiments, a radial and/or a rotational movement of the automated robot arm 300 and the wafer carrying fork 200 can be coordinated or combined to pick up, transport, and/or deliver the wafer 500 from one location to another. For example, the automated robot arm 300 and the wafer carrying fork 200 may travel to the load lock module LLM to pick up the wafer 500 positioned on the stage 102. Thereafter, the automated robot arm 300 and the wafer carrying fork 200 may transport the wafer 500 to the load port LP. In some embodiments, the stage 302 in the load module LM may be utilized to temporarily store the wafer 500 retrieved from the load lock module LLM or the load port LP by the automated robot arm 300 and the wafer carrying fork 200. It should be noted that although FIG. 1 illustrated one automated robot arm 300 and one wafer carrying fork 200, the number of the automated robot arm 300 and the number of the wafer carrying fork 200 are not limited thereto. In some alternative embodiments, multiple automated robot arms 300 and multiple wafer carrying fork 200 may be installed in the load module LM.

The wafer 500 may be loaded through the load port LP. In some embodiments, the load port LP may be configured to accommodate a plurality of cassettes 400. The cassette 400 may be a front-opening unified pod (FOUP), a front-opening shipping box (FOSB), a standard mechanical interface (SMIF) pod, and/or other suitable container. In some embodiments, the cassettes 400 may be transferred from a stocker (not shown) to the load port LP by an overhead hoist transport (OHT; not shown). In some embodiments, the cassettes 400 are containers for holding one or more wafer(s) 500 and for transporting the wafer(s) 500 between manufacturing tools. In some embodiments, the cassettes 400 may have features such as coupling locations and electronic tags to facilitate use with an automated materials handling system. The cassettes 400 are sealed in order to provide a microenvironment for the wafer 500 contained within to avoid contamination. To prevent loss of the controlled atmosphere, each cassette 400 may have a door specifically designed such that the cassette 400 remain sealed until it is docked with the load port LP.

In some embodiments, the semiconductor device manufacturing system 10 allows the wafer 500 to be transported among the wafer processing chamber C, the load lock module LLM, the load module LM, and the load port LP in any directions. For example, the wafer 500 may be transported from the wafer processing chamber C to the load port LP by passing through the load lock module LLM and the load module LM in sequential order. In some alternative embodiments, the wafer 500 may be transported from the load port LP to the wafer processing chamber C by passing through the load module LM and the load lock module LLM in sequential order.

Figure 2A:
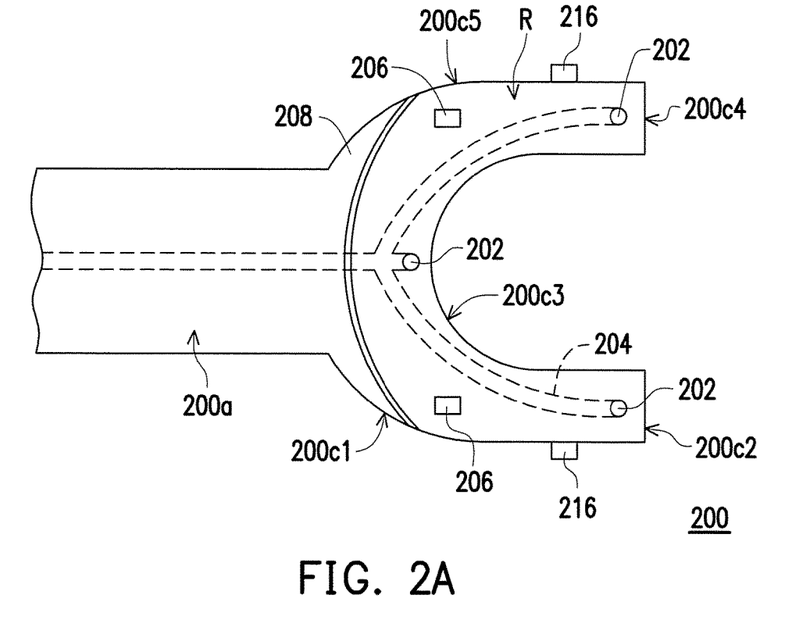
FIG. 2A is a schematic top view of a wafer carrying fork in the semiconductor device manufacturing system of FIG. 1.
Figure 2B:
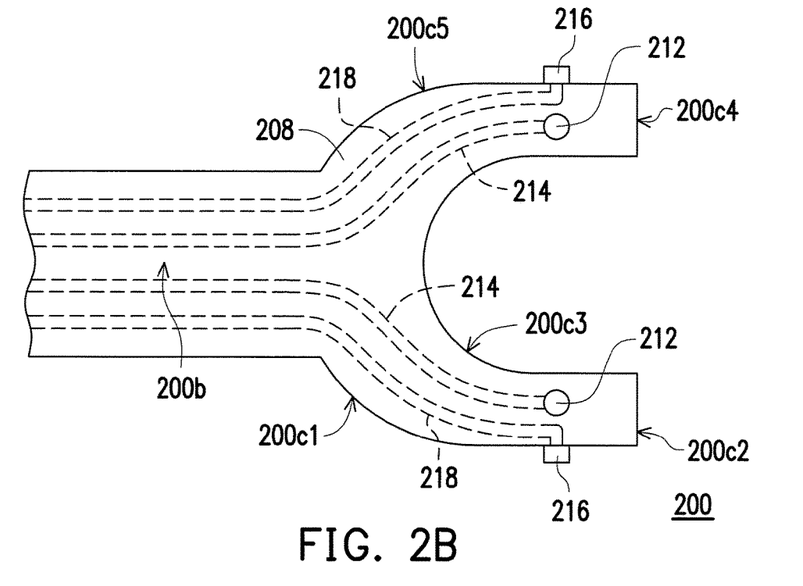
FIG. 2B is a schematic bottom view of the wafer carrying fork in the semiconductor device manufacturing system of FIG. 1.
Figure 2C:
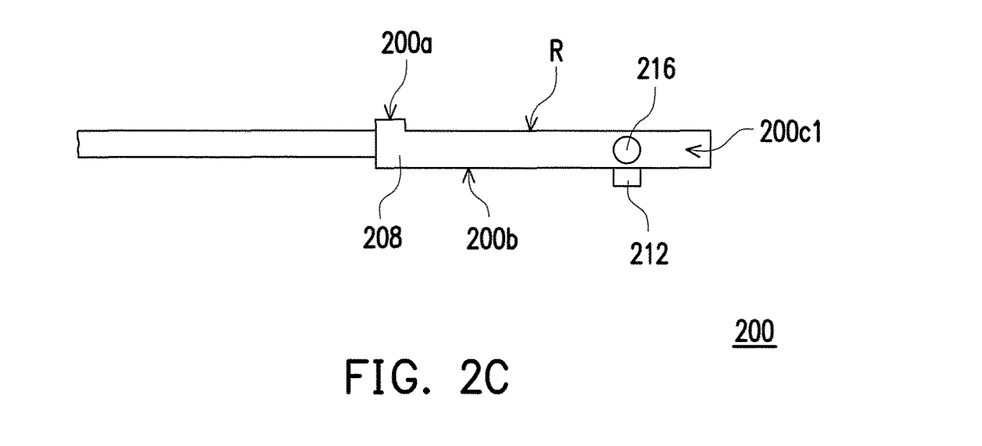
FIG. 2C is a schematic side view of the wafer carrying fork in the semiconductor device manufacturing system of FIG. 1.

FIG. 2A is a schematic top view of a wafer carrying fork 200 in the semiconductor device manufacturing system 10 of FIG. 1. FIG. 2B is a schematic bottom view of the wafer carrying fork 200 in the semiconductor device manufacturing system 10 of FIG. 1. FIG. 2C is a schematic side view of the wafer carrying fork 200 in the semiconductor device manufacturing system 10 of FIG. 1. The wafer carrying fork 200 is configured to hold the wafer 500 during transportation. The detailed descriptions with respect to the wafer carrying fork 200 in the load module LM will be discussed below.

Referring to FIGS. 2A-2C, the wafer carrying fork 200 includes a fork body 208, a plurality of wafer suction holes 202, a plurality of wafer suction pipes 204, a plurality of anti-slip pads 206, a plurality of gas suction elements 212, a plurality of gas suction pipes 214, a plurality of gas purging elements 216, and a plurality of gas purging pipes 218. The fork body 208 has a top surface 200a, a bottom surface 200b opposite to the top surface 200a, and a plurality of lateral surfaces 200c1, 200c2, 200c3, 200c4, and 200c5 connecting the top surface 200a and the bottom surface 200b. The lateral surface 200c2 is connected to the lateral surface 200c1, the lateral surface 200c3 is connected to the lateral surface 200c2, the lateral surface 200c4 is connected to the lateral surface 200c3, and the lateral surface 200c5 is connected to the lateral surface 200c4.

Referring to FIG. 2A, the wafer suction holes 202 are located on the top surface 200a of the fork body 208. In some embodiments, the wafer suction holes 202 are connected to the wafer suction pipes 204 embedded in the fork body 208. The wafer suction pipes 204 may be connected to a pump (not shown). By proving a negative pressure (vacuum) to the wafer suction pipes 204 through the pump, the wafer suction holes 202 are able to provide a suction force to securely fix the wafer 500 onto the wafer body 208. By releasing the negative pressure (vacuum break) of the wafer suction pipes 204, the wafer 500 may be released from the wafer carrying fork 200. It should be noted that the configuration of the wafer suction holes 202 in FIG. 2A merely serves as an exemplary illustration, and the number and/or the location of the wafer suction holes 202 may be altered in some alternative embodiments.

Referring to FIG. 2A and FIG. 2C, to further secure the wafer 500, the fork body 208 includes a recessed portion R for accommodating the wafer 500. The recessed portion R may create a depressed surface, and the space formed by the depressed surface (as illustrated in FIG. 2C) is able to house the wafer 500. For example, as illustrated in FIG. 2A, a profile of the recessed portion R matches a portion of a contour of the wafer 500. As such, the wafer 500 is fitted into the recessed portion R. The indentation generated from the recessed portion R is able to further secure the wafer 500 in place.

In some embodiments, further fixing measures are also provided. For example, as illustrated in FIG. 2A, the anti-slip pads 206 may be provided on the top surface 200a of the wafer body 208 to prevent the wafer 500 from slipping off the wafer carrying fork 200. It should be noted that the configuration of the anti-slip pads 206 in FIG. 2A merely serves as an exemplary illustration, and the number and/or the location of anti-slip pads 206 may be altered in some alternative embodiments. In some embodiments, the anti-slip pads 206 are optional.

Referring to FIG. 2B, the gas purging elements 216 are located on the lateral surfaces 200c1, 200c5 of the fork body 208. The gas purging elements 216 are connected to the gas purging pipes 218. In some embodiments, the gas purging pipes 218 are embedded in the fork body 208. In other words, the gas purging pipes 218 are located inside of the fork body 208. The gas purging pipes 218 may be formed by, for example, removing a portion of the fork body 208 through mechanical drilling or laser drilling to form a plurality of passages and/or inserting the pipes into the passages. In some embodiments, the gas purging elements 216 are configured to purge an inert gas. The inert gas may include nitrogen gas, argon gas, helium gas, or clean dry air (CDA). In some embodiments, the gas purging pipes 218 are connected to a tank (not shown) filled with the inert gas. A pressure may be applied to the tank by a pump (not shown) so the inert gas in the tank travels through the gas purging pipes 218 and purges through the gas purging elements 216. In some alternative embodiments, the gas purging pipes 218 may be connected to a gas cylinder or an air compressor. As illustrated in FIG. 2B and FIG. 2C, the gas purging elements 216 are located on the lateral surfaces 200c1, 200c5 of the fork body 208. However, the configuration of the gas purging elements 216 in FIG. 2B and FIG. 2C merely serves as an exemplary illustration, and the number and/or the location of the gas purging elements 216 may be altered in some alternative embodiments. For example, more or less gas purging elements 216 may be disposed on the lateral surfaces 200c2, the lateral surface 200c3, or the lateral surface 200c4.

The gas suction elements 212 are located on the bottom surface 200b of the fork body 208. The gas suction elements 212 are connected to the gas suction pipes 214. In some embodiments, similar to the gas purging pipes 218, the gas suction pipes 214 are also embedded in the fork body 208. In other words, the gas suction pipes 214 are located inside of the fork body 208. The gas suction pipes 214 may be formed by, for example, removing a portion of the fork body 208 through mechanical drilling or laser drilling to form a plurality of passages and/or inserting the pipes into the passages. In some embodiments, the gas suction elements 212 are configured to draw undesired gas in the cassettes 400. In some embodiments, the gas suction elements 212 are connected to an empty tank (not shown). A suction force may be provided to the gas suction pipes 214 so the undesired gas in the cassettes 400 may be drawn by the gas suction elements 212 and the gas suction pies 214 into the empty tank. The detailed mechanism of the gas suction elements 212 will be described later. It should be noted that the configuration of the gas suction elements 212 in FIG. 2B merely serves as an exemplary illustration, and the number and/or the location of the gas suction elements 212 may be altered in some alternative embodiments.

Figure 3:
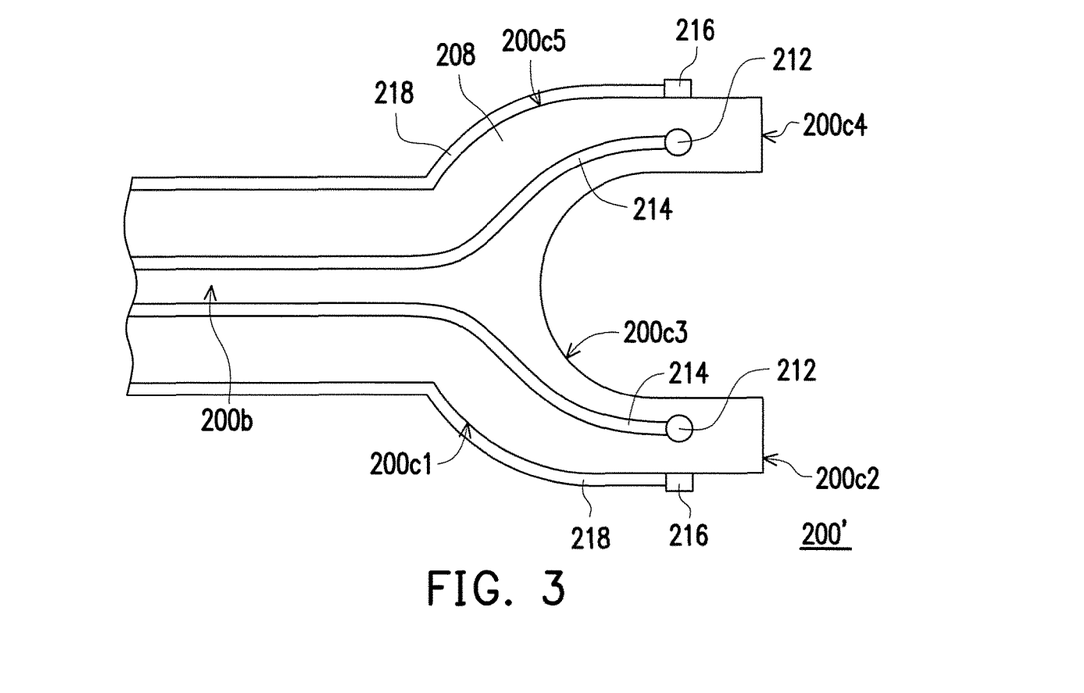
FIG. 3 is a schematic bottom view of a wafer carrying fork in accordance with some alternative embodiments of the disclosure.

FIG. 3 is a schematic bottom view of a wafer carrying fork 200' in accordance with some alternative embodiments of the disclosure. The wafer carrying fork 200' is similar to the wafer carrying fork 200 of FIG. 2B. Therefore, same elements are denoted by the same reference numeral and the detail descriptions thereof are omitted herein. As illustrated in FIG. 3, the gas purging pipes 218 and the gas suction pipes 214 are located on the exterior of the fork body 208. For example, the gas purging pipes 218 may be attached to the lateral surfaces 200c1, 200c5 of the fork body 208 and the gas suction pipes 214 may be attached to the bottom surface 200b of the fork body 208. Since the gas purging pipes 218 and the gas suction pipes 214 are located outside of the fork body 208, the existing wafer carrying fork may be easily modified by addition of gas purging and suction pipes/elements to obtain the wafer carrying fork 200'.

Figure 4A:
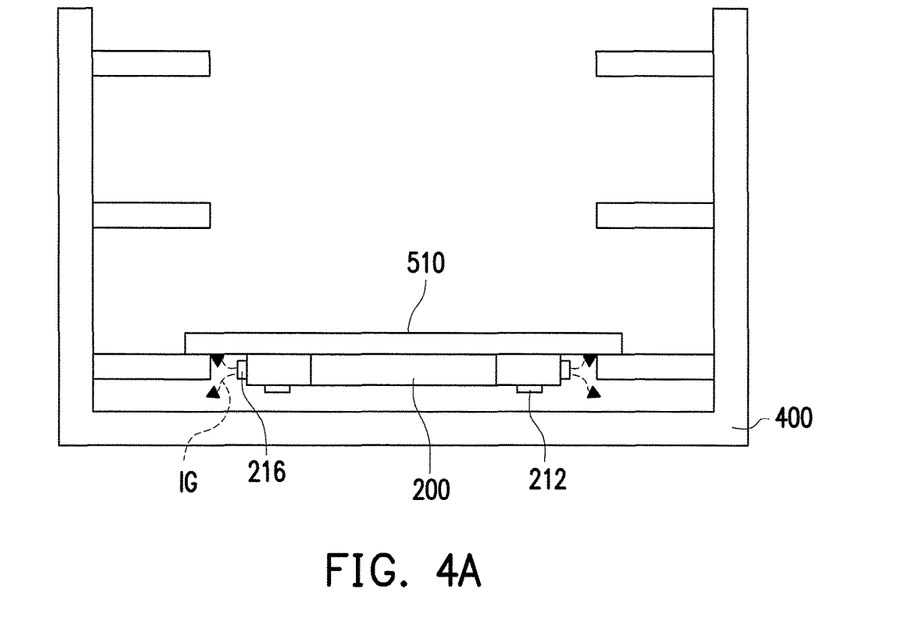
FIG. 4A is a schematic side view of a cassette in the semiconductor device manufacturing system of FIG. 1 illustrating a stage of a wafer transporting method in accordance with some embodiments of the disclosure.
Figure 4B:
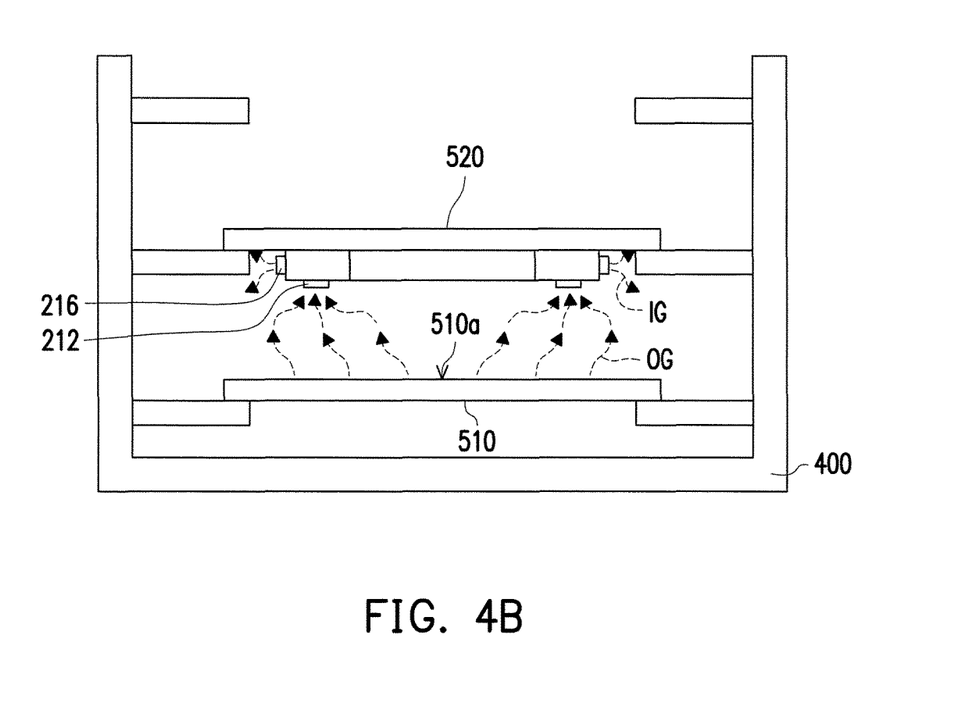
FIG. 4B is a schematic side view of the cassette in the semiconductor device manufacturing system of FIG. 1 illustrating a stage of the wafer transporting method in accordance with some embodiments of the disclosure.

FIG. 4A is a schematic side view of a cassette 400 in the semiconductor device manufacturing system 10 of FIG. 1 illustrating a stage of a wafer transporting method in accordance with some embodiments of the disclosure. FIG. 4B is a schematic side view of the cassette 400 in the semiconductor device manufacturing system 10 of FIG. 1 illustrating a stage of the wafer transporting method in accordance with some embodiments of the disclosure. Referring to FIG. 1, a wafer transporting method will be described below in conjunction with FIG. 4A and FIG. 4B. In some embodiments, a first wafer 510 and a second wafer 520 may be processed in the wafer processing chamber C. After the first wafer 510 had been processed, the transportation fork 100 of the load lock module LLM is inserted into the wafer processing chamber C to acquire the processed first wafer 510. Thereafter, the acquired first wafer 510 is transported onto the stage 102 by the transportation fork 100. Subsequently, the automated robot arm 300 and the wafer carrying fork 200 of the load module LM travels to the load lock module LLM to pick up the first wafer 510 positioned on the stage 102. Then, the first wafer 510 is transported from the load lock module LLM into the cassette 400 located in the load port LP by the wafer carrying fork 200.

As illustrated in FIG. 4A, when the wafer carrying fork 200 having the first wafer 510 attached thereto is inserted into the cassettes 400, a first gas purging process is performed. During the first gas purging process, the inert gas IG such as nitrogen gas, argon gas, helium gas, or clean dry air (CDA) are purged from the gas purging elements 216 of the wafer carrying fork 200 into the cassette 400. In other words, the majority of the volume of the cassette 400 may be occupied by the inert gas IG. As a result, moisture or other undesired gas from the atmosphere outside of the cassette 400 cannot easily infiltrate into the cassette 400, thereby ensuring a favorable storage environment for the wafers within the cassette 400. In some embodiments, a purging rate of the inert gas IG ranges between 1 m$^3$/min and 10 m$^3$/min and a purging time of the inert gas IG ranges between 1 second and 3 seconds. In some embodiments, the gas purging process may be performed on both sides of the wafer carrying fork 200 such that the inert gas IG is purged in a symmetrical manner. As such, the counter force generated by purging the inert gas IG on both sides of the wafer carrying fork 200 may be cancelled by each other, thereby suppressing undesired movement (for example, swinging in the horizontal direction) of the wafer carrying fork 200. After the first gas purging process, the first wafer 510 is released from the wafer carrying fork 200. The wafer carrying fork 200 returns to the load module LM, leaving the first wafer 510 inside of the cassette 400 to complete the transportation.

Similar procedures may be repeated for the second wafer 520. For example, after the second wafer 520 had been processed, the transportation fork 100 of the load lock module LLM is inserted into the wafer processing chamber C to acquire the processed second wafer 520. Thereafter, the acquired second wafer 520 is transported onto the stage 102 by the transportation fork 100. Subsequently, the automated robot arm 300 and the wafer carrying fork 200 of the load module LM travels to the load lock module LLM to pick up the second wafer 520 positioned on the stage 102. Then, the second wafer 520 is transported from the load lock module LLM into the cassette 400 located in the load port LP by the wafer carrying fork 200.

As illustrated in FIG. 4B, the wafer carrying fork 200 and the second wafer 520 are located above the first wafer 510 when the second wafer. 520 is transported into the cassette 400. When the wafer carrying fork 200 having the second wafer 520 attached thereto is inserted into the cassettes 400, a first gas suction process and a second gas purging process are performed. In some embodiments, a top surface 510a of the processed first wafer 510 may emit an outgassing gas OG. The outgassing gas OG may be a byproduct generated from the process previously performed on the first wafer 510. In some embodiments, the outgassing gas OG may react with the impurities in the atmosphere to create substances harmful to the wafers stored in the cassette 400. During the first gas suction process, the outgassing gas OG emitted from the first wafer 510 is drawn by the gas suction elements 212 of the wafer carrying fork 200. As such, generation of the harmful substance may be avoided to ensure the quality of the wafer. In some embodiments, a suction rate of the outgassing gas OG ranges between 1 m$^3$/min and 10 m$^3$/min and a suction time of the outgassing gas OG ranges between 1 second and 3 seconds.

Similar to the first gas purging process, during the second gas purging process, the inert gas IG such as nitrogen gas, argon gas, helium gas, or clean dry air (CDA) are purged from the gas purging elements 216 of the wafer carrying fork 200 into the cassette 400. In other words, the majority of the volume of the cassette 400 may be occupied by the inert gas IG. Since the inert gas IG is unlikely to react with the outgassing gas OG emitted from the first wafer 510, purging of the inert gas IG may further prevent generation of the harmful substances. Moreover, moisture or other undesired gas from the atmosphere outside of the cassette 400 cannot easily infiltrate into the cassette 400, thereby ensuring a favorable storage environment for the wafers within the cassette 400. In some embodiments, a purging rate of the inert gas IG ranges between 1 m$^3$/min and 10 m$^3$/min and a purging time of the inert gas IG ranges between 1 second and 3 seconds. In some embodiments, the first gas suction process and the second gas purging process may be simultaneously performed in the cassette 400. However, it construes no limitation in the disclosure. In some alternative embodiments, the first gas suction process is performed prior to the second gas purging process in the cassette 400. After the first gas suction process and the second gas purging process, the second wafer 520 is released from the wafer carrying fork 200. The wafer carrying fork 200 returns to the load module LM, leaving the second wafer 520 inside of the cassette 400 to complete the transportation process.

In accordance with some embodiments of the disclosure, a wafer carrying fork includes a fork body, a plurality of wafer suction holes, a plurality of gas purging elements, a plurality of gas purging pipes, a plurality of gas suction elements, and a plurality of gas suction pipes. The fork body has a top surface, a bottom surface opposite to the top surface, and a plurality of lateral surfaces connecting the top surface and the bottom surface. The wafer suction holes are located on the top surface of the fork body. The gas purging elements are located on the lateral surfaces of the fork body. The gas purging pipes are connected to the gas purging elements. The gas suction elements are located on the bottom surface of the fork body. The gas suction pipes are connected to the gas suction elements.

In accordance with some embodiments of the disclosure, a semiconductor device manufacturing system includes a wafer processing chamber, a load lock module, a load module, and a load port. The load lock module is adjacent to and connected with the wafer processing chamber. The load module is adjacent to and connected with the load lock module. The load module includes an automated robot arm and a wafer carrying fork connected to the automated robot arm. The wafer carrying fork includes a fork body, a plurality of wafer suction holes, a plurality of gas purging elements, a plurality of gas purging pipes, a plurality of gas suction elements, and a plurality of gas suction pipes. The fork body has a top surface, a bottom surface opposite to the top surface, and a plurality of lateral surfaces connecting the top surface and the bottom surface. The wafer suction holes are located on the top surface of the fork body. The gas purging elements are located on the lateral surfaces of the fork body. The gas purging pipes are connected to the gas purging elements. The gas suction elements are located on the bottom surface of the fork body. The gas suction pipes are connected to the gas suction elements. The load port is adjacent to and connected with the load module.

In accordance with some alternative embodiments of the disclosure, a wafer transporting method includes at least the following steps. A first wafer is transported from a wafer processing chamber into a load lock module adjacent to the wafer processing chamber. A wafer carrying fork having a plurality of gas purging elements and a plurality of gas suction elements in a load module adjacent to the load lock module is provided. The first wafer is transported from the load lock module into a cassette located in a load port by the wafer carrying fork. The load port is adjacent to the load module. A first gas purging process is performed to purge an inert gas into the cassette by the gas purging elements of the wafer carrying fork. A second wafer is transported form the wafer processing chamber into the load lock module. The second wafer is transported from the load lock module into the cassette such that the wafer carrying fork and the second wafer are located above the first wafer. A first gas suction process is performed to draw an outgassing gas emitted from a surface of the first wafer by the gas suction elements of the wafer carrying fork. A second gas purging process is performed to purge the inert gas into the cassette by the gas purging elements of the wafer carrying fork.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer carrying fork, comprising:
    a fork body having a top surface, a bottom surface opposite to the top surface, and a plurality of lateral surfaces connecting the top surface and the bottom surface;
    a plurality of wafer suction holes located on the top surface of the fork body;
    a plurality of gas purging elements located on the plurality of lateral surfaces of the fork body;
    a plurality of gas purging pipes connected to the plurality of gas purging elements;
    a plurality of gas suction elements located on the bottom surface of the fork body; and
    a plurality of gas suction pipes connected to the plurality of gas suction elements.

2. The wafer carrying fork according to claim 1, wherein the fork body comprises a recessed portion for accommodating a wafer.

3. The wafer carrying fork according to claim 1, further comprising a plurality of anti-slip pads located on the top surface of the fork body.

4. The wafer carrying fork according to claim 1, wherein the plurality of gas purging elements purges an inert gas.

5. The wafer carrying fork according to claim 4, wherein the inert gas comprises nitrogen gas, argon gas, helium gas, or clean dry air (CDA).

6. The wafer carrying fork according to claim 1, wherein the plurality of gas purging pipes and the plurality of gas suction pipes are embedded in the fork body.

7. The wafer carrying fork according to claim 1, wherein the plurality of gas purging pipes are attached to the plurality of lateral surfaces of the fork body and the plurality of gas suction pipes are attached to the bottom surface of the fork body.

8. A semiconductor device manufacturing system, comprising:
    a wafer processing chamber;
    a load lock module adjacent to and connected with the wafer processing chamber;
    a load module adjacent to and connected with the load lock module, wherein the load module comprises an automated robot arm and a wafer carrying fork connected to the automated robot arm, and the wafer carrying fork comprises:
        a fork body having a top surface, a bottom surface opposite to the top surface, and a plurality of lateral surfaces connecting the top surface and the bottom surface;
        a plurality of wafer suction holes located on the top surface of the fork body;
        a plurality of gas purging elements located on the plurality of lateral surfaces of the fork body;
        a plurality of gas purging pipes connected to the plurality of gas purging elements;
        a plurality of gas suction elements located on the bottom surface of the fork body; and
        a plurality of gas suction pipes connected to the plurality of gas suction elements; and
    a load port adjacent to and connected with the load module.

9. The semiconductor manufacturing system according to claim 8, wherein the fork body comprises a recessed portion for accommodating a wafer.

10. The semiconductor manufacturing system according to claim 8, further comprising a plurality of anti-slip pads located on the top surface of the fork body.

11. The semiconductor manufacturing system according to claim 8, wherein the plurality of gas purging elements purges an inert gas.

12. The semiconductor manufacturing system according to claim 11, wherein the inert gas comprises nitrogen gas, argon gas, helium gas, or clean dry air (CDA).

13. The semiconductor manufacturing system according to claim 8, wherein the plurality of gas purging pipes and the plurality of gas suction pipes are embedded in the fork body.

14. The semiconductor manufacturing system according to claim 8, wherein the plurality of gas purging pipes are attached to the plurality of lateral surfaces of the fork body and the plurality of gas suction pipes are attached to the bottom surface of the fork body.

15. A wafer transporting method, comprising:
    transporting a first wafer from a wafer processing chamber into a load lock module adjacent to the wafer processing chamber;
    providing a wafer carrying fork having a plurality of gas purging elements and a plurality of gas suction elements in a load module adjacent to the load lock module;
    transporting the first wafer from the load lock module into a cassette located in a load port by the wafer carrying fork, wherein the load port is adjacent to the load module;
    performing a first gas purging process purging an inert gas into the cassette by the plurality of gas purging elements of the wafer carrying fork;

transporting a second wafer from the wafer processing chamber into the load lock module;

transporting the second wafer from the load lock module into the cassette such that the wafer carrying fork and the second wafer are located above the first wafer;

performing a first gas suction process drawing an outgassing gas emitted from a surface of the first wafer by the plurality of gas suction elements of the wafer carrying fork; and performing a second gas purging process purging the inert gas into the cassette by the plurality of gas purging elements of the wafer carrying fork.

16. The method according to claim 15, wherein the first gas suction process and the second gas purging process are simultaneously performed in the cassette.

17. The method according to claim 15, wherein the first gas suction process precedes the second gas purging process in the cassette.

18. The method according to claim 15, wherein the inert gas comprises nitrogen gas, argon gas, helium gas, or clean dry air (CDA).

19. The method according to claim 15, wherein a purging rate of the inert gas ranges between 1 $m^3$/min and 10 $m^3$/min and a purging time of the inert gas ranges between 1 second and 3 seconds.

20. The method according to claim 15, wherein a suction rate of the outgassing gas ranges between 1 $m^3$/min and 10 $m^3$/min and a suction time of the outgassing ranges between 1 second and 3 seconds.

\* \* \* \* \*